United States Patent [19]

Masuyama et al.

[11] Patent Number: 5,114,529
[45] Date of Patent: May 19, 1992

[54] PLASMA PROCESSING METHOD AND APPARATUS

[75] Inventors: Akira Masuyama, Kusatsu; Takaki Saitoh, Ohtsu, both of Japan

[73] Assignee: International Business Machines Corporation, Armonk, N.Y.

[21] Appl. No.: 682,825

[22] Filed: Apr. 9, 1991

[30] Foreign Application Priority Data

Apr. 10, 1990 [JP] Japan .................................. 2-93309

[51] Int. Cl.$^5$ .......................... B44C 1/22; B29C 37/00
[52] U.S. Cl. ........................................ 156/643; 134/1;
156/646; 156/655; 156/668; 156/345;
204/192.36; 204/298.37
[58] Field of Search ............. 156/643, 646, 655, 659.1,
156/661.1, 662, 668, 345; 252/79.1; 134/1;
204/192.36, 298.37, 298.38, 298.39

[56] References Cited

U.S. PATENT DOCUMENTS

| | | | |
|---|---|---|---|
| 4,512,868 | 4/1985 | Fujimura et al. | 204/298 |
| 4,609,428 | 9/1986 | Fujimura | 156/643 |
| 4,836,902 | 6/1989 | Kalnitsky et al. | 204/192.32 |
| 5,024,748 | 6/1991 | Fujimura | 204/298.38 |
| 5,032,202 | 7/1991 | Tsai et al. | 156/345 |
| 5,061,838 | 10/1991 | Lane et al. | 219/121.59 |

*Primary Examiner*—William A. Powell
*Attorney, Agent, or Firm*—Richard A. Romanchik

[57] ABSTRACT

A plasma processing apparatus includes an oxygen source 14 which provides gas to a plasma generating means 16 for generating plasma in a plasma generating area 40. Gas flows from the plasma generating area 40 to a wafer 30 placed in a processing area 60. A magnetic field generating area 50, located between the plasma generating area 40 and the processing area 60 is created by coils 20 and a power source 21. Charged particles are reflected by the magnetic field and are thus prevented from reaching the wafer 30. A baffle 22 is disposed above the processing area 60 to partly block charged particles.

15 Claims, 1 Drawing Sheet

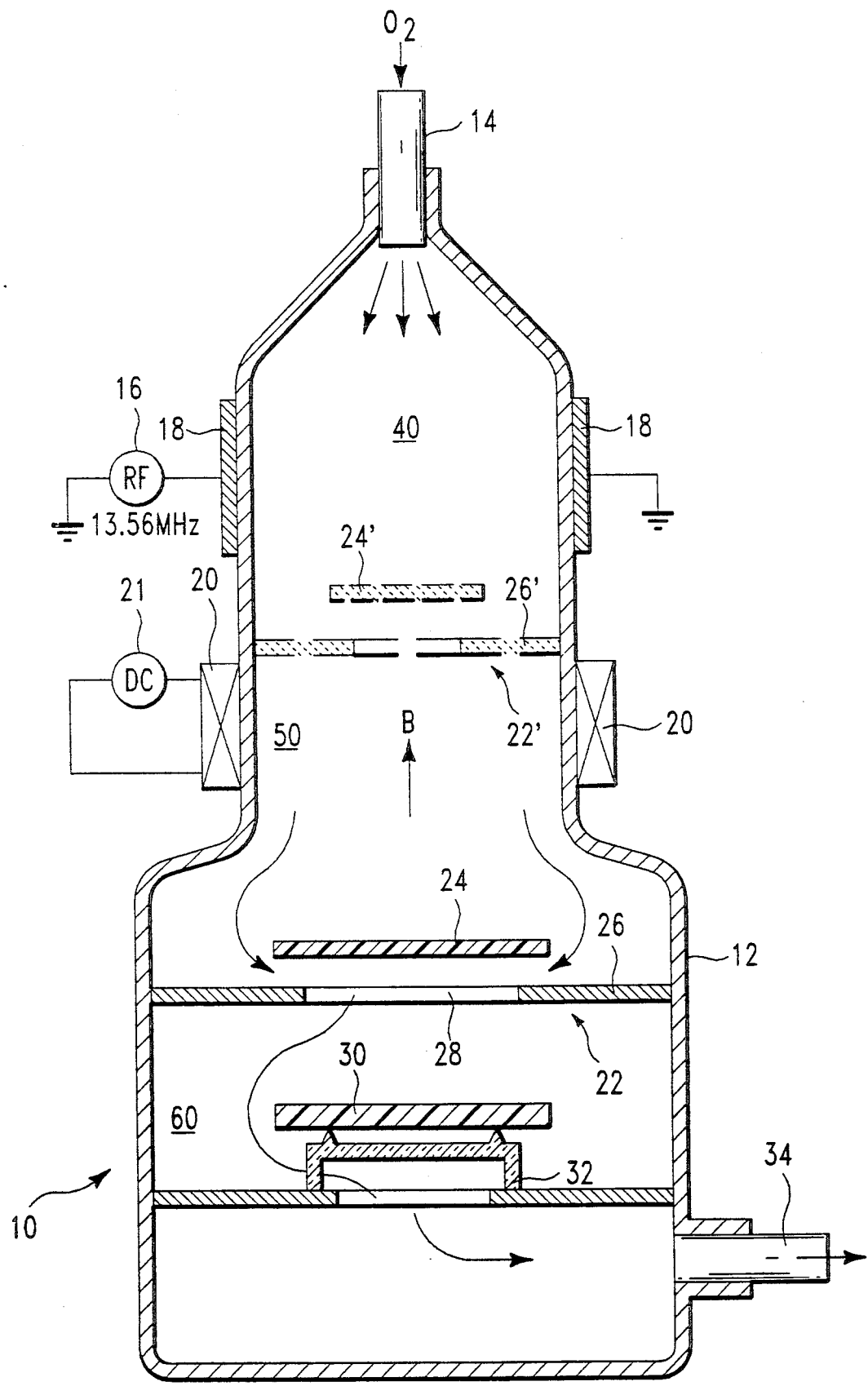

PLASMA PROCESSING METHOD AND APPARATUS

FIELD OF THE INVENTION

This invention relates to a plasma processing method and apparatus, and more particularly to a plasma processing method and apparatus suited to ashing photoresist on a semiconductor wafer.

PRIOR ART

It is difficult to remove photoresist from a semiconductor wafer by wet etching after the wafer is subjected to an etching or ion-implantation process. Therefore, plasma ashing is commonly used to remove the photoresist. Photoresist ashing is typically performed by utilizing an oxygen plasma. In oxygen plasma ashing, atomic oxygen (0) works as a chemically-active reaction species and reacts with the photoresist to decompose and remove the photoresist.

However, the oxygen plasma includes not only electrically-neutral plasma species such as atomic oxygen and excited state oxygen, but also charged particles consisting of positive and negative oxygen ions and electrons. These charged particles cause various problems during ashing.

One of the problems is caused by the bombardment of ions in the plasma. Photoresist normally contains impurities which include ions of alkali metals (such as sodium and potassium), and ions of heavy metals (such as iron and nickel), which are mixed in manufacturing of the photoresist. These impurities adhere to the surface of the oxide film under the resist during ashing. The adhered impurities are then easily knocked into the oxide film by the bombardment of ions accelerated in the plasma, thereby causing the characteristics of semiconductor devices to be degraded. Plasma ions also bombard the inner wall and the sealed portion of a plasma processing chamber, causing impurities to be produced by sputtering.

Another problem with oxygen plasmas is caused by the electrons in the plasma. If a large electric field is generated across an insulating thin film, (such as gate oxide), due to electrons which are attached to the substrate surface during ashing, dielectric breakdown occurs, which may damage the device. As the demand for more compact and higher-performance devices increases, the damage caused by these charged particles becomes significant.

The above problems may occur not only in resist ashing using oxygen plasma, but also in plasma processing such as ordinary plasma etching and plasma CVD (chemical vapor deposition) using electrically-neutral and chemically-active reaction species or radicals. They may occur in manufacturing not only semiconductor devices, but also other devices such as magnetic and optical disks.

Therefore, for plasma processing using electrically-neutral reaction species, it is desirable to prevent charged particles from flowing to the workpiece and to supply only neutral reaction species effective for plasma processing to the workpiece.

Japanese Published Unexamined Patent Application (JPUPA) 58-91173 (publication date: May 31, 1983) discloses an apparatus to diagnose radicals by blocking ions with an ion repeller to extract only neutral radicals in plasma. The ion repeller is a grid or mesh installed in the plasma chamber. Because both positive and negative ions are included in the plasma, both positive and negative-voltage repellers need to be provided in the plasma processing apparatus to repel both kinds of ions. In this case, however, the positive-voltage repeller is sputtered by negative ions and the negative-voltage repeller by positive ions, causing the problem of contamination. Though one repeller at ground potential may be used, the problem of contamination due to sputtering still occurs. In fact, it has been found that charged particles pass through the mesh.

JPUPA 62-179728 (publication date: Aug. 6, 1987) discloses a resist ashing apparatus to separate electrons and ions with a magnet and send only active oxygen to the reaction area. The magnet is arranged so that magnetic line of force generated by the magnet is perpendicular to the gas flow to deflect charged particles with the action of the magnetic field, thereby preventing charged particles from reaching the workpiece. However, this method is unacceptable because contamination may occur when deflected ions collide with the inner wall of the processing chamber or when ions reflected from the chamber wall bombard the workpiece.

DISCLOSURE OF THE INVENTION

The object of the present invention is to provide an improved plasma tool capable of solving the problems caused by charged particles in plasma.

The present invention makes it possible to almost completely prevent charged particles emitted from a plasma generating area from reaching a workpiece. Therefore, the invention is very effective in protecting a workpiece from contamination and damage due to charged particles during plasma processing period. Moreover, since the problems caused by charged particles can be prevented even for a high plasma density, great quantities of electrically-neutral reaction species can be supplied to the processing area by increasing the processing-gas pressure. Consequently, plasma processing efficiency can be improved. In addition, the present invention has a relatively simple configuration and is easily serviceable.

The present invention solves the above problems by generating a mirror magnetic field between the plasma generating area and processing area and restricting the charged particles in the plasma from moving from the plasma generating area to the processing area. The mirror magnetic field is preferably generated by a coil, in parallel with the direction of gas flow from the plasma generating area to the processing area. If a baffle is provided between the mirror magnetic field area and the workpiece and/or plasma generating area to at least partly interrupt charged particles, it is possible to more effectively prevent charged particles from flowing to the workpiece.

These and other objects, features and advantages of the present invention will become more apparent in light of the detailed description of exemplary embodiments thereof, as illustrated by the drawing.

BRIEF DESCRIPTION OF THE DRAWING

The single drawing is a schematic cross-sectional view of the plasma processing apparatus of the present invention.

BEST MODE FOR CARRYING OUT THE INVENTION

Referring now to the drawing, a plasma processing apparatus 10 includes a plasma processing chamber 12, consisting of a vessel made of quartz or alumina. Oxygen gas is led into chamber 12 through an inlet duct 14 at the top of the chamber and exhausted through an outlet duct 34 at the bottom of chamber 12. Chamber 12 is initially evacuated to about $10^{-6}$ torr, and then oxygen gas is introduced to a processing pressure of, for example, 4.5 torr. The oxygen-gas flow rate is, for example, 4,000 SCCM.

Oxygen plasma is generated in a plasma generating area 40 by applying RF (radio frequency) power to electrodes 18 installed at the top of chamber 12. RF power supply 16 is utilized to supply the RF power. The RF power which may be used is, for example, 700W at 13.56 MHz.

A semiconductor wafer 30, which is the workpiece to be processed with plasma, is held on a support 32 and is installed in a processing area 60 of chamber 12. Wafer 30 is covered with a photoresist layer which should be removed through plasma ashing. Wafer 30 is heated to 250° C., for example, by a halogen lamp (not shown) during ashing.

A coil 20, utilized to generate a mirror magnetic field according to this invention, is installed in a mirror magnetic field generating area 50 between plasma a generating area 40 and processing area 60 as will be described in greater detail hereinafter. Coil 20 is energized by a DC power supply 21 to generate in area 50, a mirror magnetic field parallel with the direction of gas flow from the top to the bottom. In this example, magnetic-field direction B is shown upward in the drawing. However, it is also permitted to be downward, as will be mentioned later.

A baffle 22, consisting of baffle members 24 and 26, is installed between the mirror magnetic field generating area 50 and the semiconductor wafer 30. In this example, the center of baffle member 26 has a circular opening 28 with a diameter smaller than that of wafer 30. Baffle member 24 has a diameter approximately equal to that of wafer 30, and is installed immediately above opening 28 of baffle member 26. The illustrated plasma processing apparatus 10 is the downstream type in which the gas in chamber 12 flows downward from inlet duct 14, enters processing area 60 through baffle 22 along the arrows shown in the figure, advances to the bottom of chamber 12, and is exhausted from outlet duct 34.

Oxygen led in from inlet duct 14 is ionized by the RF power applied to electrodes 18 to thereby generate oxygen plasma. The plasma includes not only neutral plasma species of atomic and excited oxygen, but also charged plasma species of positive and negative ions and electrons. Charged particles are accelerated in the plasma generation process and move at a high speed. However, the charged particles moving toward processing area 60 are reflected by the mirror magnetic field generated in area 50 by coil 20 and returned to plasma area 40. The reason for this reflection is because coil 20 generates a funnel-shaped magnetic field distribution in which magnetic line of force converges at the position of coil 20 and spreads toward plasma generating area 40. The magnetic field intensity is highest at the convergence position and consequently functions as a magnetic mirror. When charged particles approach the magnetic mirror from plasma generating area 40, the spiral angle of their cyclotron motion changes and the particles are returned by the repulsive force of the magnetic mirror. This phenomenon is known in high-temperature nuclear-fusion plasma confinement theory as the magnetic mirror effect.

The magnetic mirror effect is effective for both ions and electrons, with the only difference being that the direction of cyclotron motion of ions is opposite to that of electrons. For optimum performance, the mirror magnetic field should be parallel to the gas flow. It is to be noted that the magnetic field direction may be downward. In such a case, the direction of the cyclotron motion of ions and electrons will be reversed.

The intensity of the magnetic field needed to provide magnetic mirror effect depends on the angle between the vertical direction, (or the direction connecting inlet duct 14 and semiconductor wafer 30), and the charged-particle moving direction. Charged particles moving at large angles with respect to the vertical direction demonstrate the magnetic mirror effect with a small magnetic field. Alternatively, a large magnetic field is necessary to give the magnetic mirror effect to charged particles moving at small angles to the vertical direction. To prevent charged particles from reaching a wafer, it is preferable to reflect as many charged particles as possible with the mirror magnetic field. However, to reflect charged particles moving at an angle of 1° to the vertical direction, a magnetic field of about 1,000 G is necessary, whereas the magnetic field needed to reflect charged particles which make angles of 5° to 15° to the vertical direction ranges between 10 and 100 Gauss, though it depends on the shape of the plasma processing apparatus and the plasma generating conditions. Therefore, it is preferable to reflect the charged particles having larger angles with respect to the vertical direction, and to block charged particles having smaller angles. Baffle 22 is utilized for this blocking function. Charged particles having smaller angles are interrupted by baffle 22 and decelerated. Some of these decelerated charged particles are recombined, and others may flow to processing area 60 through the gap between baffle members 24 and 26. However, the quantity of particles flowing through the gap is extremely small and since they are also decelerated, the problem of impurity metal knocking-in is minimized. Predominantly electrically-neutral plasma species are therefore carried to processing area 60 by the gas flow and are effectively used for resist ashing.

Baffle 22 is installed between mirror magnetic field generating area 50 and wafer 30. Instead of baffle 22, however, it is also possible to install baffle 22', consisting of baffle members 24' and 26' (shown by a broken line), between plasma generating area 40 and mirror magnetic field generating area 50. In this case, charged particles which make small angles to the vertical direction are interrupted by baffle 22'. As a result, only charged particles which make large angles to the vertical direction pass through baffle 22'. Therefore, this baffle arrangement makes it possible to more effectively block charged particles with less coil power. It is also possible to install both baffles 22 and 22'.

The following table shows the amount of impurity metal ions (alkali metal ions and heavy metal ions) contained in a silicon oxide layer having a thickness of 250 angstrom thermally grown on a 5-inch silicon wafer. Item (1) shows the case without ashing. Item (2) shows the case after ashing the phenol-novolac-type positive resist of 1.6 μ thick, on the silicon oxide layer, without using the mirror magnetic field and baffle. Item (3) shows the case after ashing the resist only with baffle 22 of the present invention. Item (4) shows the case after ashing the resist with the mirror magnetic field and baffle 22 or 22'. To remove impurities or contaminants from the oxide layer surface, and measure only the impurities in the oxide layer, the wafer is washed by a heated aqueous solution of sulfuric acid and hydrogen peroxide after ashing.

TABLE

| | Case | Number of Impurity Metal Ions (ions/cm$^2$) in Silicon Oxide Layer |
|---|---|---|
| (1) | Without ashing | $0.2 \times 10^{10}$ |
| (2) | Ashing without the mirror magnetic field and baffle | $3.7 \times 10^{10}$ |
| (3) | Ashing with only baffle | $1.4 \times 10^{10}$ |
| (4) | Ashing with the mirror magnetic field and baffle | $0.3-0.5 \times 10^{10}$ |

Ashing was conducted under the conditions mentioned above. When both the mirror magnetic field and the baffle are used, the contamination level can almost be decreased to the level when no ashing is applied, though the number of impurity metal ions in the oxide layer depends slightly on the mirror magnetic field intensity and the baffle configuration. For best performance, the baffle should be made of quartz or alumina free from impurities, because the baffle is bombarded by charged particles.

In the above embodiment, RF power is used as the means to generate plasma. However, this invention can be applied to plasma processing apparatus using other well-known plasma generating means, such as 2.45 GHz microwave power and ECR (Electron Cyclotron Resonance). Regardless of the type of plasma generating means used, charged particles emitted or leaked from the plasma generating area can effectively be restricted from reaching a workpiece by generating a mirror magnetic field in parallel with the gas flow between the plasma generating area and plasma processing area.

Also, although resist ashing using O$_2$ plasma is shown in the above embodiment, it should be understood that this invention can also be applied to resist ashing using a mixture gas such as (O$_2$+CF$_4$), and to plasma etching and plasma CVD using electrically-neutral reaction species.

In addition, although a coil is used as the means to generate a mirror magnetic field in the embodiment, a magnet can also be used. It is also to be noted that various shapes and configurations of baffles can be used.

Although the invention has been shown and described with exemplary embodiments thereof, it should be understood by those skilled in the art that the foregoing and various other changes, omissions and additions may be made therein and thereto without departing from the spirit and scope of the invention.

What is claimed is:

1. A plasma processing method comprising the steps of:
   generating a plasma containing electricallyneutral reaction species in a plasma generating area;
   processing a workpiece by said reaction species in a processing area; and,
   generating a mirror magnetic field between said plasma generating area and said processing area for restricting charged particles from moving from said plasma generating area to said processing area.

2. A plasma processing method according to claim 1, wherein said workpiece is a semiconductor wafer having photoresist on its surface, and the processing is photoresist ashing.

3. A plasma processing method according to claim 1, wherein said mirror magnetic field is generated by an electrical coil disposed between said plasma generating area and said processing area.

4. A plasma processing method to claim 1, wherein the direction of said mirror magnetic field is parallel to that of gas flow from said plasma generating area to said processing area.

5. A plasma processing method according to claim 4, wherein said plasma generating area is located above said processing and the gas flows downward.

6. A plasma processing method according to claim 1, wherein said plasma generating area is located above said processing area and the gas flows downward.

7. A plasma processing method according to claim 1, further comprising the step of: partly blocking charged particles with a baffle installed between said mirror magnetic field and said workpiece.

8. A plasma processing method according to claim 1, further comprising the step of: partly blocking charged particles with a baffle installed between said mirror magnetic field and said plasma generating area.

9. A plasma processing apparatus comprising:
   plasma generating means for generating plasma containing electrically-neutral reaction species;
   a processing area for processing a workpiece with said reaction species; and,
   mirror magnetic field generating means disposed between said plasma generating means and said processing area for restricting charged particles from moving from said plasma generating means to said processing area.

10. A plasma processing apparatus according to claim 9, wherein said workpiece is a semiconductor wafer having photoresist on its surface, and the processing is photoresist ashing.

11. A plasma processing apparatus according to claim 9, wherein said mirror magnetic field generating means is an electrical coil.

12. A plasma processing apparatus according to claim 9, wherein the direction of said mirror magnetic field is parallel to that of gas flow from said plasma generating area to said processing area.

13. A plasma processing apparatus according to claim 9, wherein said plasma generating means is located above said processing area, and the gas flows downward.

14. A plasma processing apparatus according to claim 9, further comprising a baffle installed between said mirror magnetic field generating means and said workpiece to at least partly block charged particles.

15. A plasma processing apparatus according to claim 9, further comprising a baffle installed between said mirror magnetic field generating means and said plasma generating means to at least partly block charged particles.

* * * * *